(12) United States Patent
Saito et al.

(10) Patent No.: US 11,023,021 B2
(45) Date of Patent: Jun. 1, 2021

(54) COOLING SYSTEM TO MINIMIZE GENERATION OF BUBBLES INSIDE FLOW PASSAGE BY UTILIZING AN AUXILIARY PUMP

(71) Applicant: ExaScaler Inc., Tokyo (JP)

(72) Inventors: Motoaki Saito, Tokyo (JP); Sunao Torii, Tokyo (JP)

(73) Assignee: EXASCALER INC., Tokyo (JP)

( * ) Notice: Subject to any disclaimer, the term of this patent is extended or adjusted under 35 U.S.C. 154(b) by 413 days.

(21) Appl. No.: 16/097,168

(22) PCT Filed: Apr. 28, 2016

(86) PCT No.: PCT/JP2016/063510
§ 371 (c)(1),
(2) Date: Oct. 26, 2018

(87) PCT Pub. No.: WO2017/187644
PCT Pub. Date: Nov. 2, 2017

(65) Prior Publication Data
US 2021/0103320 A1   Apr. 8, 2021

(51) Int. Cl.
*G05D 7/06* (2006.01)
*G06F 1/20* (2006.01)

(52) U.S. Cl.
CPC ........... *G06F 1/206* (2013.01); *G05D 7/0676* (2013.01)

(58) Field of Classification Search
CPC .................................................. G05D 7/0676
(Continued)

(56) References Cited

U.S. PATENT DOCUMENTS 3,827,236 A * 8/1974 Rust .................... F01M 5/00
60/605.1
5,293,754 A    3/1994 Mizuno
(Continued)

FOREIGN PATENT DOCUMENTS

JP     62-80160 U1   5/1987
JP     6-179015 A    6/1994
(Continued)

OTHER PUBLICATIONS

Extended European Search Report for related EP App No. 16900514.7 dated Nov. 21, 2019, 8 pgs.
(Continued)

*Primary Examiner* — Suresh Suryawanshi
(74) *Attorney, Agent, or Firm* — Procopio, Cory, Hargreaves & Savitch LLP

(57) ABSTRACT

Provided is a cooling system capable of effectively avoiding generation of bubbles in the flow passage including the piping unit that climbs over the barrier upon start of the pump that has been in the stopped state. The cooling system 100 includes a cooling tank 11 filled with a coolant C, flow passages 15, 16 through which the coolant discharged from an outlet of the cooling tank 11 returns to an inlet of the cooling tank 11, an inverted U-like piping unit 16a disposed in the middle of the flow passage 16, a main pump 31, an auxiliary pump 33 disposed opposite the main pump 31 while interposing the inverted U-like piping unit 16a with the main pump 31, and a controller 35 which controls driving operations of the main pump 31 and the auxiliary pump 33. The controller 35 drives the auxiliary pump 33 for a predetermined time period before starting the main pump 31. The predetermined time period for driving the auxiliary pump 33 may be arbitrarily set so long as the preliminary flow of the coolant C is generated. As the auxiliary pump 33 may be driven for only a short time period, silence in the
(Continued)

room is hardly deteriorated even in the case that the pump is disposed inside the building.

5 Claims, 2 Drawing Sheets

(58) Field of Classification Search
USPC .......................................................... 700/282
See application file for complete search history.

(56) References Cited

U.S. PATENT DOCUMENTS

| 2011/0253347 | A1  | 10/2011 | Harrington |             |
|--------------|-----|---------|------------|-------------|
| 2016/0265834 | A1* | 9/2016  | Chen       | F25D 31/002 |
| 2016/0278239 | A1* | 9/2016  | Chainer    | H05K 7/20318 |
| 2018/0034087 | A1* | 2/2018  | Watanabe   | H01M 8/04014 |
| 2018/0363994 | A1* | 12/2018 | Saito      | H05K 7/20263 |

FOREIGN PATENT DOCUMENTS

| JP | 2008-76511   A | 4/2008  |
| JP | 2008079511   A | 4/2008  |
| JP | 2012-527109  A | 11/2012 |
| JP | 2013-187251  A | 9/2013  |

OTHER PUBLICATIONS

Decision to Grant a Patent for related JP Patent Application No. 2017-541888, dated Sep. 22, 2017, in 6 pages.

International Preliminary Report on Patentability for related PCT Application No. PCT/JP2016/063510, dated Oct. 30, 2018, in 5 pages.

International Search Report and for related International Application No. PCT/JP2016/063510, dated May 31, 2016, English translation provided; 3 pages.

ExaScaler Inc., et al.; Press Release; Mar. 31, 2015; Partial translation provided; 7 pages.

* cited by examiner

COOLING SYSTEM TO MINIMIZE GENERATION OF BUBBLES INSIDE FLOW PASSAGE BY UTILIZING AN AUXILIARY PUMP

TECHNICAL FIELD

The present invention relates to a cooling system. More specifically, the present invention relates to the cooling system having a flow passage through which a coolant discharged from the outlet of the cooling tank returns to the inlet of the cooling tank. The present invention may be suitably applied to the cooling system for electronic devices, which is configured to efficiently cool the electronic devices such as the supercomputer and the data center which are required to exhibit super-high performances and stable operations while generating high heating values.

BACKGROUND ART

Conventionally, the process for cooling the supercomputer and the data center has been implemented through two different methods, that is, the air cooling method and the liquid cooling method. In general, the cooling efficiency of the liquid cooling method is better than that of the air cooling method because liquid exhibits superior heat transfer performance to that of air. As an example, the liquid immersion cooling system using the fluorocarbon-based coolant has been proposed. Specifically, the use of the fluorocarbon-based coolant (hydrofluoroether (HFE) compound manufactured by 3M Japan Products Limited called "Novec (trademark of 3M) 7100", "Novec 7200", "Novec 7300") is exemplified (for example, Patent Literatures 1 and 2).

The applicant has already developed the compact liquid immersion cooling system with excellent cooling efficiency suitable for the supercomputer of small-scale liquid immersion cooling type. The system employs the fluorocarbon-based coolant formed from the complete fluoride. Such system has been applied to the compact super computer "Suiren" installed in the high-energy accelerator research organization, and operated (Non-patent Literature 1).

CITATION LIST

Patent Literature

Patent Literature 1: Japanese Patent Application Laid-Open No. 2013-187251
Patent Literature 2: Japanese Translation of PCT International Application Publication No. 2012-527109
Non-Patent Literature 1: "Liquid immersion cooling compact supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL: http://exascaler.co.jp/wp-content/uploads/2015/03/20150331.pdf

SUMMARY OF INVENTION

Technical Problem

The improved cooling efficiency of the liquid immersion cooling system, and progress of technical development for high density mount of the electronic devices applied to the liquid immersion cooling system have made it possible to further miniaturize the supercomputer. An attempt has been made to install the miniaturized supercomputer in the tiny space in the building, for example, the office or laboratory for an individual researcher working for the research institute.

The liquid immersion cooling system generally includes a cooling tank and a heat exchanger. The cooling tank serves to directly cool a plurality of electronic devices using the coolant circulating in the cooling tank. Outside the cooling tank, the heat exchanger cools the coolant which has been warmed resulting from taking heat from the electronic devices. A flow passage such as piping and a pump are disposed between the cooling tank and the heat exchanger.

The pump will be continuously driven while the liquid immersion cooling system is operated so that the coolant is circulated. In order to secure the silence in the room, it is essential to place the pump outside the room. As the piping work tends to be restricted owing to the structure or layout of the building, the piping for connection between the outlet of the pump and the inlet of the cooling tank is required to be disposed to climb over a barrier positioned between the pump and the cooling tank at constant height. In other words, the piping unit that climbs over the barrier, for example, an inverted U-like piping unit has to be disposed in the middle of the flow passage for connection between the outlet of the pump and the inlet of the cooling tank.

The inverted U-like piping unit may be the cause of bubbles generated inside the flow passage filled with the coolant upon start of the pump that has been in the stopped state. This applies to the case of using the unit alternative to the inverted U-like piping, for example, an inverted L-like or inverted J-like piping unit. The generated bubbles reaching the pump after passing through the flow passage to be accumulated in the pump (such phenomenon may be called "air entrainment") may cause the problem of noise or reduced flow rate, and in the worst case, breakage of the pump. It has been thought that the similar problems as described above may occur if the cooling system including the flow passage through which the coolant discharged from the outlet of the cooling tank returns to the inlet of the cooling tank has the piping unit that climbs over the barrier disposed in the middle of the flow passage.

It is an object of the present invention to provide the cooling system configured to effectively avoid generation of bubbles in the flow passage including the piping unit that climbs over the barrier when starting the pump that has been in the stopped state.

Solution to Problem

For solving the above-described problem, the present invention provides a cooling system which includes a cooling tank, a flow passage through which a coolant discharged from an outlet of the cooling tank returns to an inlet of the cooling tank, a piping unit which climbs over a barrier formed in the middle of the flow passage, a main pump, an auxiliary pump disposed opposite the main pump while interposing the piping unit climbing over the barrier with the main pump, and a controller which controls driving operations of the main pump and the auxiliary pump. The controller drives the auxiliary pump for a predetermined time period before starting the main pump so as to generate a preliminary flow of the coolant in the flow passage.

Employing the structure that the auxiliary pump is disposed opposite the main pump having the piping unit climbing over the barrier interposed with the auxiliary pump, the inventors tried to generate a preliminary flow of the coolant by driving the auxiliary pump for a relatively short time period before starting the main pump so as to generate a big and strong flow of the coolant in the flow passage. They found out the fact that the above-described structure is effective for avoiding generation of bubbles in the flow passage when starting the main pump that has been in the stopped state. The invention, thus has been completed based on the findings.

In a preferred embodiment of the cooling system according to the present invention, the cooling system may further include a heat exchanger for cooling the coolant outside the cooling tank, which has been warmed in the cooling tank. The heat exchanger may be configured to have an inlet connected to the outlet of the cooling tank, and an outlet connected to an inlet of the main pump.

In a preferred embodiment of the cooling system according to the present invention, the piping unit climbing over the barrier may have an inverted U-like shape, an inverted L-like shape, or an inverted J-like shape. The piping unit may be disposed to climb over the barrier that divides the building into an indoor space and an outdoor space. The cooling tank and the auxiliary pump may be disposed indoors, and the main pump and the heat exchanger are disposed outdoors.

In a preferred embodiment of the cooling system according to the present invention, the cooling system may be configured to immerse an electronic device in the coolant filled in the cooling tank for direct cooling, and may further include a receiver disposed between the cooling tank and a floor surface to receive the coolant leaked from the cooling tank.

In a preferred embodiment of the cooling system according to the present invention, the receiver may be constituted by a distribution plate for distributing a load applied from the cooling tank, a closed side wall disposed on the distribution plate to enclose the cooling tank, and a lid member for covering an upper opening between the closed side wall and the cooling tank.

Advantageous Effects of Invention

The present invention is capable of providing the cooling system configured to effectively avoid generation of bubbles in the flow passage having the piping unit that climbs over the barrier upon start of the pump that has been in the stopped state.

The above-described and any other objects and advantages of the present invention will be clearly understood in reference to the following description of an embodiment. The description herein is for an illustrative purpose, and therefore, the present invention is not limited to the embodiment.

DESCRIPTION OF EMBODIMENT

A preferred embodiment of the cooling system according to the present invention will be described in detail based on the drawings. The explanation will be made as an embodiment that the present invention has been applied to the cooling system for the electronic devices. It is to be understood that the present invention is widely applicable to the cooling system which includes the flow passage through which the coolant discharged from the outlet of the cooling tank returns to the inlet thereof, and the piping unit that climbs over the barrier in the middle of the flow passage.

Figure 1:
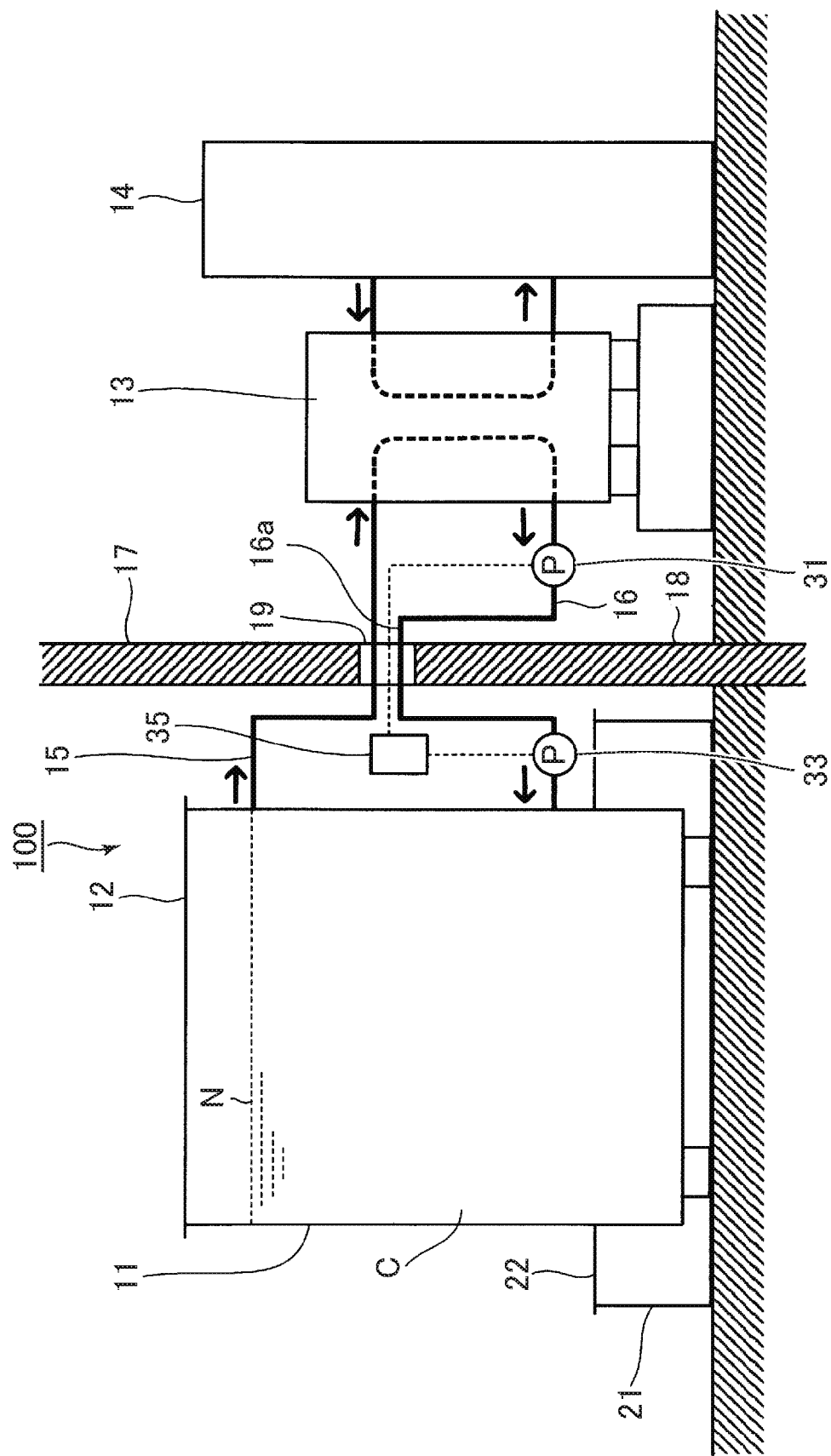
FIG. 1 is a side view of a cooling system according to an embodiment of the present invention.

Referring to FIG. 1, a cooling system 100 according to an embodiment includes a cooling tank 11 filled with a coolant C, flow passages 15, 16 through which the coolant discharged from an outlet of the cooling tank 11 returns to an inlet thereof, an inverted U-like piping unit 16a disposed in the middle of the flow passage 16, a main pump 31, an auxiliary pump 33 disposed opposite the main pump 31 while interposing the inverted U-like piping unit 16a with the main pump 31, and a controller 35 for controlling driving operations of the main pump 31 and the auxiliary pump 33. A plurality of electronic devices (not shown) are immersed in the coolant C that circulates in the cooling tank 11 so as to be directly cooled. Preferably, the cooling tank 11 has an open space. The cooling tank 11 having the "open space" described in the specification includes the cooling tank with a simple sealing structure sufficient to secure maintainability of the electronic device. The simple sealing structure refers to the one that allows a top plate 12 to be openably or detachably mounted onto the opening of the cooling tank 11 via a packing or the like.

The cooling tank 11 is filled with the coolant C enough for immersion of the entire bodies of the electronic devices (not shown) up to the liquid surface N. It is preferable to use a fluorine-based inert liquid famed of the complete fluoride (perfluorocarbon compound) well known as "Fluorinert (trademark of 3M) FC-72" (boiling point: 56° C.), "Fluorinert FC-770" (boiling point: 95° C.), "Fluorinert FC-3283" (boiling point 128° C.), "Fluorinert FC-40" (boiling point: 155° C.), "Fluorinert FC-43" (boiling point: 174° C.), all of which are products of 3M. However, it is possible to use the coolant of any other type in a non-restrictive way.

Focusing on the complete fluoride that exhibits excellent characteristics such as high electric insulation, high heat transfer capacity, inertness and high thermal/chemical stability, incombustibility, and zero ozone depletion potential derived from the oxygen-free compound, the applicant has filed the patent application relating to the cooling system configured to use the coolant that contains the complete fluoride as the main component as the refrigerant for immersion cooling of the highly densified electronic devices (Japanese Patent Application No. 2014-170616). As disclosed in the prior art, the use of Fluorinert FC-43 or FC-40 as the coolant is significantly advantageous for efficiently cooling the electronic devices disposed with high density in the cooling tank 11 of a small volume, while remarkably lessening the loss of the coolant C due to evaporation from the cooling tank 11 with the open space.

Fluorinert FC-43 or FC-40 has the boiling point equal to or higher than 150° C., which hardly evaporates. It is possible to attach the top plate 12 onto the upper opening of the cooling tank 11 detachably or openably so as to facilitate the maintenance of the electronic device (not shown). For example, it is possible to support the top plate 12 openably using a not shown hinge attached to one edge of the upper opening of the cooling tank 11.

The coolant C which has been warmed as a result of taking heat from the electronic devices in the cooling tank 11 is cooled by the heat exchanger 13 outside the cooling tank 11. It is possible to use various types of heat exchanger (so called radiator, chiller, cooling tower) including a condenser of air cooling type, water cooling type, or evaporation type.

An additional heat exchanger 14 which may be the refrigerator (cooing tower and the like), for example, is configured to transfer heat taken from the coolant C by the heat exchanger 13 so as to make the temperature low through the refrigerating operation. If the heat exchanger 13 exhibits sufficient heat exchanging efficiency, the additional heat exchanger 14 may be omitted.

The cooling system 100 according to the embodiment is configured to cope with problems concerning leakage of the coolant from the cooling tank, and collection of the leaked coolant. That is, the cooling system 100 includes a receiver 21 disposed between the cooling tank 11 and the floor surface so as to receive the coolant C leaked from the cooling tank 11.

Figure 2:
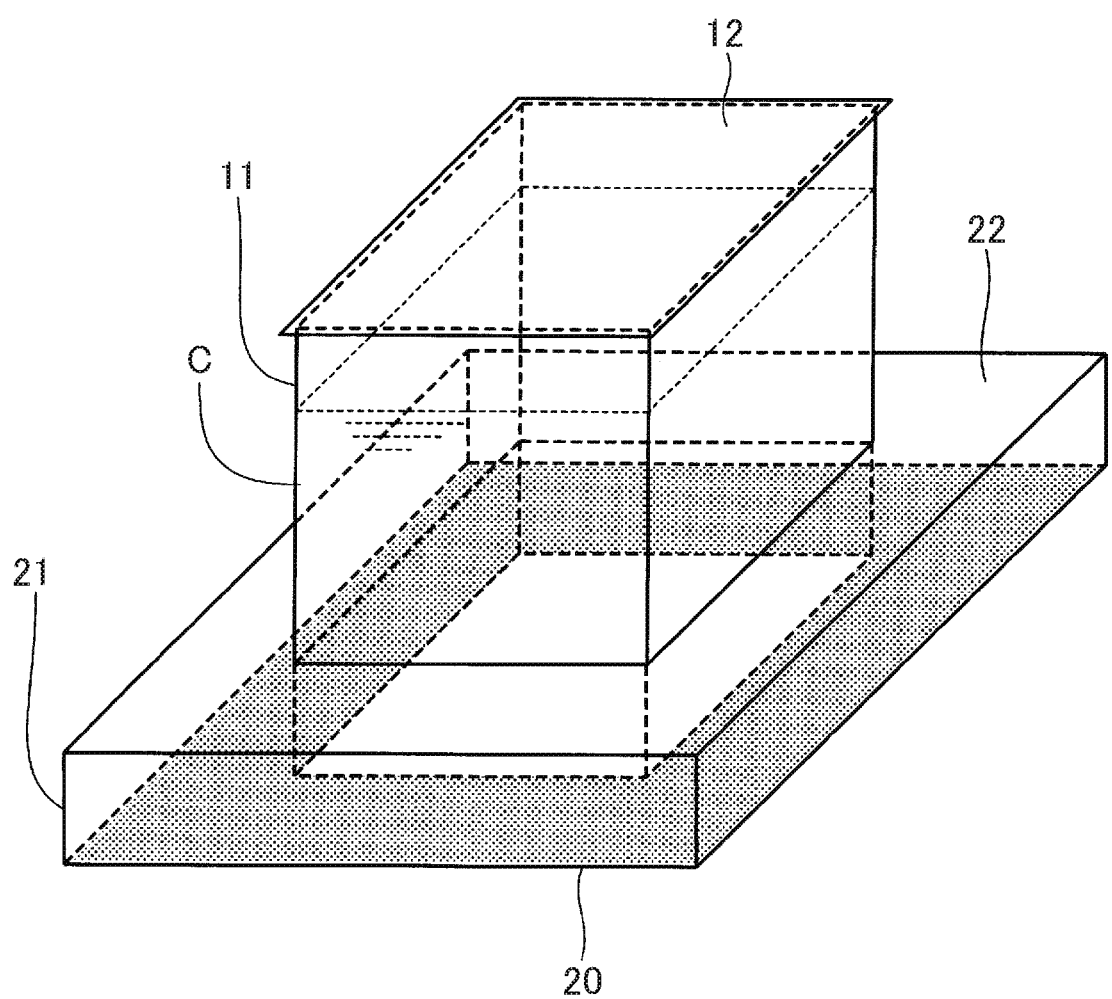
FIG. 2 is a partial perspective view of the cooling system according to the embodiment of the present invention.

As FIG. 2 shows, the receiver 21 includes a distribution plate 20 for distributing the load applied from the cooling tank 11, a closed side wall disposed on the distribution plate 20 to enclose the cooling tank 11, and a lid member 22 that covers the upper opening between the closed side wall and the cooling tank 11. Preferably, the receiver 21 has the capacity sufficient to entirely accommodate the possible maximum amount of the coolant leaked out from the cooling tank 11. The above-structured receiver 21 may provide the following advantageous points. That is, the bottom surface of the receiver 21 in contact with the floor surface serves as the distribution plate with wide area, which allows distribution of the load applied from the cooling tank 11 over the wide area. The height of the side wall of the receiver 21 may be kept low. The lid member 22 serves to prevent the foreign substance contamination in the leaked coolant from the upper opening. Finally, the access to the cooling tank 11 may be facilitated by closing the upper opening.

Referring back to FIG. 1, securing silence in the room may be regarded as one of problems to be solved especially when installing the cooling tank 11 in which the electronic devices are immersed in the tiny space (for example, the office or laboratory for the individual researcher in the research institute) in the building. In the operation state of the cooling system 100, the main pump 31 is continuously operated, which may be the cause of deteriorating the silence in the room. Accordingly, for the purpose of securing the silence in the room, the main pump 31 is required to be disposed and driven outside the building, separated from the inside the room with a structure 17 such as a wall. In addition, as FIG. 1 shows, a piping work 19 to the structure 17 is restricted owing to the structure or layout of the building. There may be the case that requires the piping for connection between the outlet of the main pump 31 and the inlet of the cooling tank 11 to be disposed while climbing over a barrier 18 between the main pump 31 and the cooling tank 11 at constant height. In such a case, it is essential to dispose an inverted U-like piping unit 16a in the middle of the flow passage 16. The above-described inverted U-like piping unit 16a may cause bubbles to be generated in the flow passage filled with the coolant. This applies to the use of the inverted L-like or the inverted J-like piping unit instead of the inverted U-like piping unit 16a.

In this embodiment, an auxiliary pump 33 is disposed opposite the main pump 31 while having the inverted U-like piping unit 16a interposed with the auxiliary pump 33. The above-described structure effectively avoids the problem caused by bubbles generated in the flow passage resulting from the start of the pump that has been in the stopped state. A controller 35 generates a signal concerning at least ON/OFF operation to be supplied to the main pump 31 and the auxiliary pump 33 so that driving operations of the main pump 31 and the auxiliary pump 33 are separately controlled. In this embodiment, the controller 35 drives the auxiliary pump 33 for a predetermined time period before starting the main pump 31. Compared with the main pump 31, the auxiliary pump 33 is smaller in size with smaller discharge amount. The predetermined time period for driving the auxiliary pump 33 may be in the range from several seconds to several tens seconds until the preliminary flow of the coolant C is generated. In this way, the auxiliary pump 33 may be driven for a short time period upon the start of the main pump 31. Therefore, the silence in the room is hardly deteriorated even if the pump is disposed inside the building.

In the above-described embodiment, the electronic device may include the processor installed on the board. The processor may be configured to include a CPU (Central Processing Unit) and/or a GPU (Graphics Processing Unit). The electronic device may include the high-speed memory, chipset, network unit, PCI Express bus, bus switch unit, SSD (Solid State Drive), and power unit (AC-DC converter, DC-DC voltage converter). The electronic device may be the server including the blade server, the router, and the storage unit such as the SSD.

INDUSTRIAL APPLICABILITY

The present invention is widely applicable to the cooling system including the flow passage through which the coolant discharged from the outlet of the cooling tank returns to the inlet thereof.

REFERENCE SIGNS LIST

100: cooling system,
11: cooling tank,
12: top plate,
13: heat exchanger,
14: another heat exchanger,
15, 16: flow passage
16a: inverted U-like piping unit,
17: structure,
18: barrier,
19: piping work,
20: distribution plate,
21: receiver,
22: lid member,
31: main pump,
33: auxiliary pump,
35: controller

The invention claimed is:
1. A cooling system comprising:
a cooling tank;
a flow passage through which a coolant discharged from an outlet of the cooling tank returns to an inlet of the cooling tank;
a piping unit which climbs over a barrier formed in the middle of the flow passage;
a main pump;
an auxiliary pump disposed opposite the main pump while interposing the piping unit climbing over the barrier with the main pump, and
a controller which controls driving operations of the main pump and the auxiliary pump, wherein the controller drives the auxiliary pump for a predetermined time period before starting the main pump so as to generate a preliminary flow of the coolant in the flow passage.
2. The cooling system according to claim 1, further comprising a heat exchanger for cooling the coolant outside the cooling tank, the coolant having been warmed in the cooling tank, wherein an inlet of the heat exchanger is connected to the outlet of the cooling tank, and an outlet of the heat exchanger is connected to an inlet of the main pump.

3. The cooling system according to claim 2, wherein:
the piping unit climbing over the barrier has an inverted U-like shape, an inverted L-like shape, or an inverted J-like shape;
the piping unit is disposed to climb over the barrier that divides the building into an indoor space and an outdoor space; and
the cooling tank and the auxiliary pump are disposed indoors, and the main pump and the heat exchanger are disposed outdoors.

4. The cooling system according to claim 3, immersing an electronic device in the coolant filled in the cooling tank for direct cooling, the cooling system further comprising a receiver disposed between the cooling tank and a floor surface to receive the coolant leaked from the cooling tank.

5. The cooling system according to claim 4, wherein the receiver includes a distribution plate for distributing a load applied from the cooling tank, a closed side wall disposed on the distribution plate to enclose the cooling tank, and a lid member for covering an upper opening between the closed side wall and the cooling tank.

* * * * *